(12) United States Patent
Gris et al.

(10) Patent No.: US 6,607,960 B2
(45) Date of Patent: Aug. 19, 2003

(54) BIPOLAR TRANSISTOR MANUFACTURING METHOD

(75) Inventors: Yvon Gris, Tullins (FR); Thierry Schwartzmann, Le Versoud (FR)

(73) Assignee: STMicroelectronics S.A., Montrouge (FR)

( * ) Notice: Subject to any disclaimer, the term of this patent is extended or adjusted under 35 U.S.C. 154(b) by 24 days.

(21) Appl. No.: 09/832,288

(22) Filed: Apr. 10, 2001

(65) Prior Publication Data
US 2001/0034103 A1 Oct. 25, 2001

(30) Foreign Application Priority Data
Apr. 10, 2000 (FR) .............................. 00 04588

(51) Int. Cl.[7] .............................. H01L 21/36
(52) U.S. Cl. .............. 438/322; 438/357; 438/359; 438/370; 438/341
(58) Field of Search ................. 438/322, 313, 438/341, 357, 358, 359, 370

(56) References Cited

U.S. PATENT DOCUMENTS

| 4,819,052 A | 4/1989 | Hutter |
| 4,951,115 A | 8/1990 | Harame et al. |
| 4,997,775 A | 3/1991 | Cook et al. |
| 4,997,776 A | 3/1991 | Harame et al. |
| 5,175,607 A | 12/1992 | Ikeda |
| 5,187,554 A | 4/1993 | Miwa |
| 5,240,867 A | 8/1993 | Suzuki et al. |
| 5,411,898 A | 5/1995 | Kinoshita et al. |

FOREIGN PATENT DOCUMENTS

| FR | 2 543 740 A1 | 10/1984 |

OTHER PUBLICATIONS

French Search Report from French patent application No. 00 04588, filed Apr. 10, 2000.

Primary Examiner—Richard Elms
Assistant Examiner—Beth E. Owens
(74) Attorney, Agent, or Firm—Wolf, Greenfield & Sacks, P.C.; James H. Morris

(57) ABSTRACT

A method of manufacturing a bipolar transistor in a P-type substrate, including the steps of forming in the substrate a first N-type area; forming by epitaxy a first silicon layer; forming in this first layer, and substantially above the first area a second heavily-doped P-type area separate from the second area; forming at the periphery of this second area a third N-type area; forming by epitaxy a second silicon layer; forming a deep trench crossing the first and second silicon layers, penetrating into the substrate and laterally separating the second area from the third area; and performing an anneal such that the dopant of the third area is in continuity with that of the first area.

22 Claims, 7 Drawing Sheets

BIPOLAR TRANSISTOR MANUFACTURING METHOD

BACKGROUND OF THE INVENTION

1. Field of the Invention

The present invention relates to the manufacturing of integrated circuits and more specifically to the manufacturing of a PNP-type bipolar transistor of optimized characteristics or the simultaneous manufacturing of an NPN-type bipolar transistor and of a PNP-type bipolar transistor both having optimized characteristics. The present invention is especially compatible with complementary MOS-type (CMOS) components manufacturing techniques or techniques in which components of bipolar type and MOS type-components are simultaneously made in a same semiconductor substrate (BICMOS).

2. Discussion of the Related Art

In particular, for bipolar transistors to be adapted to operating at high frequency, their stray capacitances and internal resistances, and especially the collector resistance, have to be minimized.

FIG. 1 shows a conventional structure associating an NPN-type bipolar transistor and a PNP-type bipolar transistor. The NPN transistor is shown on the left-hand side of the drawing and the PNP transistor is shown on the right-hand side. The structure is formed based on a semiconductor single-crystal silicon P-type substrate 1. In this substrate, various implantations have been performed. A region 2 corresponding to the buried collector of the NPN transistor is formed by an $N^+$-type implantation. On the side of the PNP transistor, an N-type implantation is used to define an insulation area of this transistor and a buried collector area 4 is formed by a $P^3$-type implantation. A $P^+$-type insulation implantation 6 is formed at the periphery of the NPN transistor, this implantation being preferably performed at the same time as when forming collector 4 of the PNP transistor. An $N^+$-type implantation 7 is formed at the periphery of the PNP transistor, this implantation being preferably performed at the same time as the collector implantation of the NPN transistor.

After this, an epitaxy step has been performed to obtain a lightly-doped layer over the entire surface of the device. After processing, this layer is N-type doped on the side of the NPN transistor (reference 10) to form its collector and is P-type doped (reference 11) on the side of-the PNP transistor to form its collector. It is preferably N-type doped at the periphery of the PNP transistor to contribute to its insulation. On the NPN transistor side, a P-type base region 12 and an N-type emitter region 13 have been formed in epitaxial layer 10, for example by diffusion from a polysilicon area 14. A collector well 16 is in contact with buried layer 2. On the PNP transistor side, an N-type base region 18 in which an emitter region 19 is formed, for example by diffusion from a P-type doped polysilicon area 20, has been formed in P-type region 11. Just as for the NPN transistor, a P-type collector well 22 contacts collector buried layer 4.

Various elements of the components of FIG. 1 have not been described, especially the field insulation and contacting areas. These are indeed conventional elements within the abilities of those skilled in the art, which can refer to usual works on semiconductors or to publications of STMicroelectronics Company.

FIGS. 2A, 2B, and 2C show curves of concentration in atoms per cm3 as a function of distance d. FIG. 2A corresponds to cross-section plane I-I taken depthwise on the side of the NPN transistor, FIG. 2B corresponds to cross-section plane II-II depthwise on the side of the PNP transistor, and FIG. 2C corresponds to cross-section plane III-III in the transverse direction from the collector buried layer of the NPN transistor to the collector buried layer of the PNP transistor. In these drawings, the reference of the corresponding curve has been represented for each curve portion.

These curves will be described to show the compromises with which those skilled in the art are confronted to simultaneously optimize the performances of the NPN and PNP transistors.

As shown in FIG. 2A, the collector of the NPN transistor corresponds to region 10, which is a portion of an epitaxial layer, possibly appropriately overdoped, and to a region 2 which corresponds to a buried layer and which is used to take the collector contact vertically via collector well 16. To optimize the operation of the NPN transistor, the thickness corresponding to layer portion 10 must be carefully chosen. This thickness, which is not very different from the thickness of the epitaxial layer, must not be too small, so that the transistor can have a satisfactory breakdown voltage. It must, however, be as small as possible to enable the transistor to operate at a high frequency.

Now considering the PNP transistor, in relation with FIG. 2B, several delicate compromises have to be made. In particular, the doping of insulating layer 3 must be sufficiently large. Given that the dopants of layers 3 and 4 interpenetrate, a relatively high implantation level has to be chosen for P layer 4, to have a sufficiently high final P-type doping of region 4. This increase of the doping level of buried layer 4 results in a compensation of the N doping of region 3, and this problem is difficult to solve. Further, buried layer 4 tends to rise higher in epitaxial layer 11. To have a sufficient remaining lightly-doped collector region 11 after the various thermal processings, an epitaxial layer thicker than what would be desired for the previously-described NPN transistor optimization has to be chosen.

Referring to FIG. 2C, it should be noted that in fact, at the level of the shown crosssection, the doping level of insulating region 6 will be higher than the doping level of buried layer 4. Indeed, as previously indicated, the characteristics of buried layer 4 result from a compensation between the desired P-type doping and the N-type doping of insulating layer 3. Thus, region 6 is very heavily doped, more than what would be desired, and this increases the lateral stray capacitance between buried collector 2 of the NPN transistor and insulation layer 6, which is at the substrate potential. Thus, the collector/substrate capacitance of the NPN transistor increases, which adversely affects its operating speed and its power consumption. To avoid the various problems due to these stray capacitances, it will be understood by considering FIG. 2C that the implantations have to be spaced apart from one another, which results in buried layers 2, 6, 7, and 4. This results in an increase of the surface area occupied by the components.

Compromises thus inevitably have to be made, as indicated previously, as for the choice of the thickness of epitaxial layer 10–11, for the choice of the doping level of the P-type buried layers, and for the choice of the doping level of insulating layer 3. Compromises thus have to be made, especially between the optimization of the NPN transistor and the PNP transistor optimization.

SUMMARY OF THE INVENTION

An object of the present invention is to provide a novel PNP transistor structure which can be associated with an NPN transistor enabling simultaneous optimization of the characteristics of the PNP and NPN transistors, and a method for manufacturing such a structure.

More specifically, an object of the present invention is to provide a method enabling selection of the doping level of the P-type collector buried layer of a PNP transistor relatively independently from the other transistor parameters.

Another object of the present invention is to provide such a method in which the forming of the PNP transistor insulation layers is optimized.

Another object of the present invention is to provide such a method enabling reduction of the stray collector-substrate capacitance of the NPN transistor.

Another object of the present invention is to provide such a method enabling association of an NPN transistor and of a PNP transistor in a reduced silicon surface area.

Another object of the present invention is to provide such a method enabling formation of a novel NPN transistor structure with a high breakdown voltage.

Another object of the present invention is to provide such a method enabling association of complementary bipolar transistors and of complementary MOS transistors on a reduced silicon surface area.

To achieve these and other objects, the present invention provides a method of manufacturing a bipolar transistor in a substrate of a first conductivity type, including the steps of forming in the substrate a first area of a second conductivity type; forming by epitaxy a first silicon layer; forming in this first silicon layer, and substantially above the first area, a second heavily-doped area, of the first conductivity type, separate from the second area; forming at the periphery of this second area a third area of the second conductivity type; forming by epitaxy a second silicon layer; forming a deep trench crossing the first and second silicon layers, penetrating into the substrate and laterally separating the second area from the third area; and performing an anneal such that the dopant of the third area is continuous with that of the first area.

According to an embodiment of the present invention, the first conductivity type is type P and the second conductivity type is type N, the formed transistor being a PNP transistor, and the method further includes the forming of an NPN-type transistor for which a heavily-doped N-type layer is formed in the first silicon layer, the region corresponding to the NPN transistor being separated from the region corresponding to the PNP transistor by at least one trench.

According to an embodiment of the present invention, an NPN transistor, the collector buried layer of which corresponds to said first area is further formed.

The present invention also provides a bipolar PNP-type transistor formed in two successive epitaxial layers on a P-type substrate, including in its central portion a first N area diffused in the P substrate, a second P+ layer formed in the first epitaxial layer, an N base and P+ emitter structure formed in the second epitaxial layer; a ring-shaped trench dug into the silicon, crossing the two epitaxial layers and penetrating into the substrate, the second area being laterally delimited by this ring, the first area extending at least partially under said ring; and outside the ring, a third N+ area formed in the first epitaxial layer and contacting the first N area.

According to an embodiment of the present invention, the PNP-type bipolar transistor includes a second trench crossing the two epitaxial silicon layers and surrounding the third N+ layer.

According to an embodiment of the present invention, an NPN-type bipolar transistor includes, in its central portion a same first N area, a fourth N area formed in the first epitaxial layer, a P base and N+ emitter structure formed in the second epitaxial layer; a ring-shaped trench dug into the silicon, crossing the two epitaxial layers and penetrating into the substrate, the fourth area being laterally delimited by this ring, the first area extending at least partially under said ring; and outside the ring, a third N+ area formed in the first epitaxial layer and contacting the first N area.

The foregoing objects, features and advantages of the present invention, will be discussed in detail in the following non-limiting description of specific embodiments in connection the accompanying drawings.

DETAILED DESCRIPTION

Figure 1:
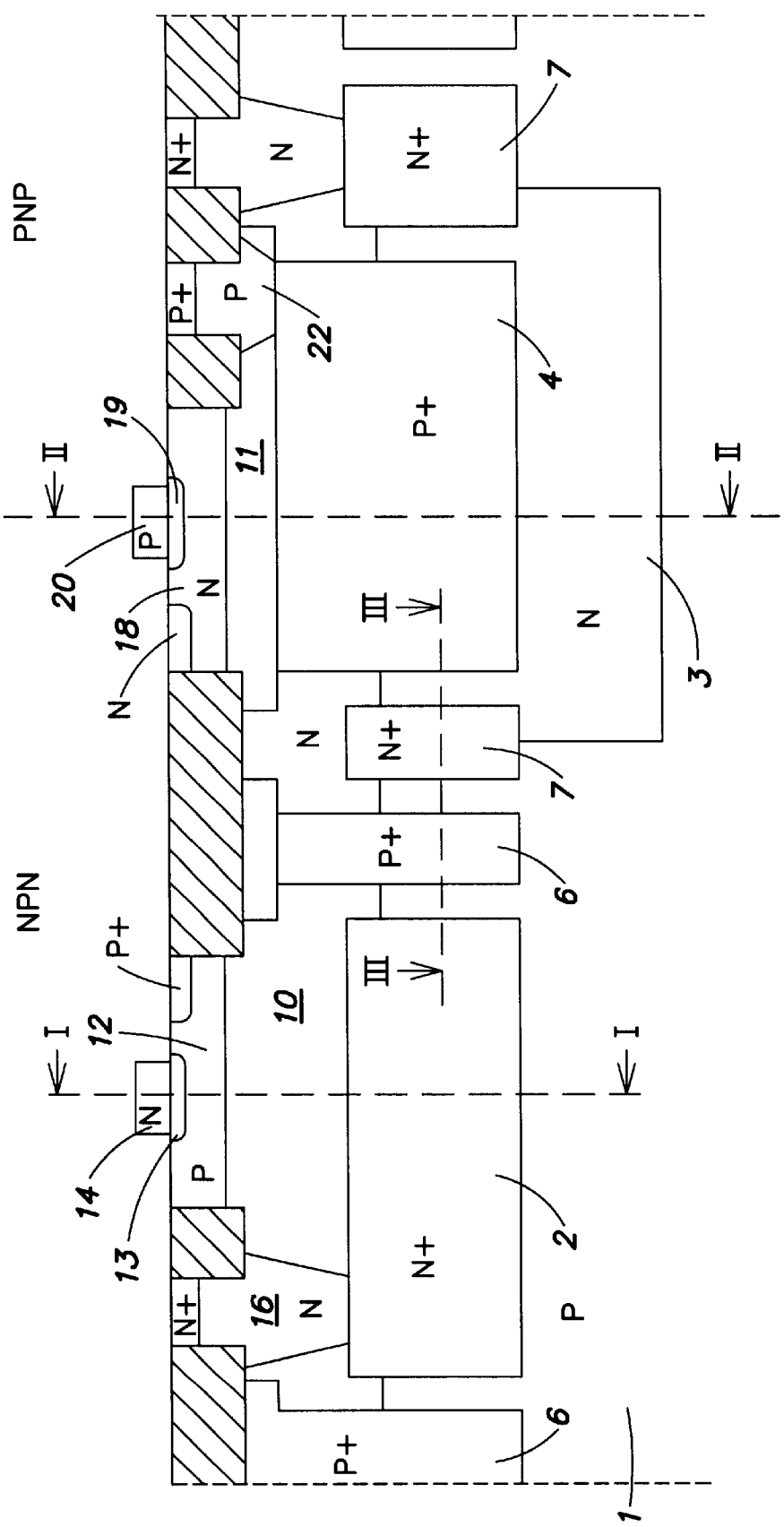
FIG. 1, previously described, shows a conventional structure associating an NPN transistor and a PNP transistor.

As usual in the representation of integrated circuits, the various layers and regions of the various drawings are not to scale, to ease the understanding. In the drawings, same references designate identical or similar layers.

Figure 3A:
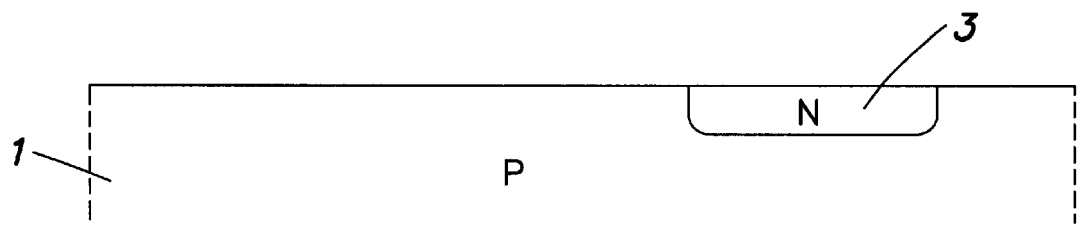
FIGS. 3A to 3F are cross-section views of successive steps of a manufacturing method enabling simultaneous forming of an NPN transistor and of a PNP transistor according to the present invention.

In a first step of implementation of the present invention, illustrated in FIG. 3A, an N-type doped region 3 is formed in a P-type substrate 1, currently by implantation, on the side where a PNP transistor is desired to be formed.

In the next drawings, the left-hand portion of the drawing corresponds to a region in which an NPN-transistor is desired to be formed and the right-hand portion of the drawing to an area in which a PNP transistor is desired to be formed.

Figure 3B:
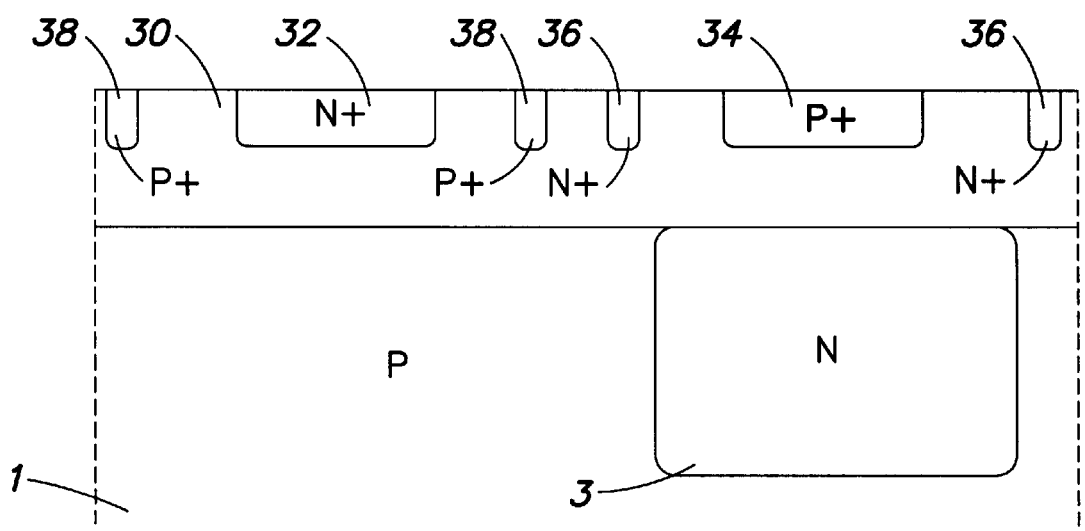

At a next step illustrated in FIG. 3B, a lightly-doped epitaxial layer 30 is developed on the wafer. This epitaxy step is preceded by a step of diffusion and redistribution of the dopants of layer 3. On the NPN transistor side, a heavily-doped N-type region 32 is formed, which will correspond to the collector of the NPN transistor. On the PNP transistor side, a P-type doped region 34 is formed, which will correspond to the collector of the PNP transistor. At the same time as N-type region 32 is formed, a heavily-doped N-type region 36 is formed at the periphery of region 34. Similarly, at the same time as heavily-doped P-type region 34 is formed, a P-type region 38 is formed at the periphery of collector buried layer 32 of the NPN transistor.

Figure 3C:
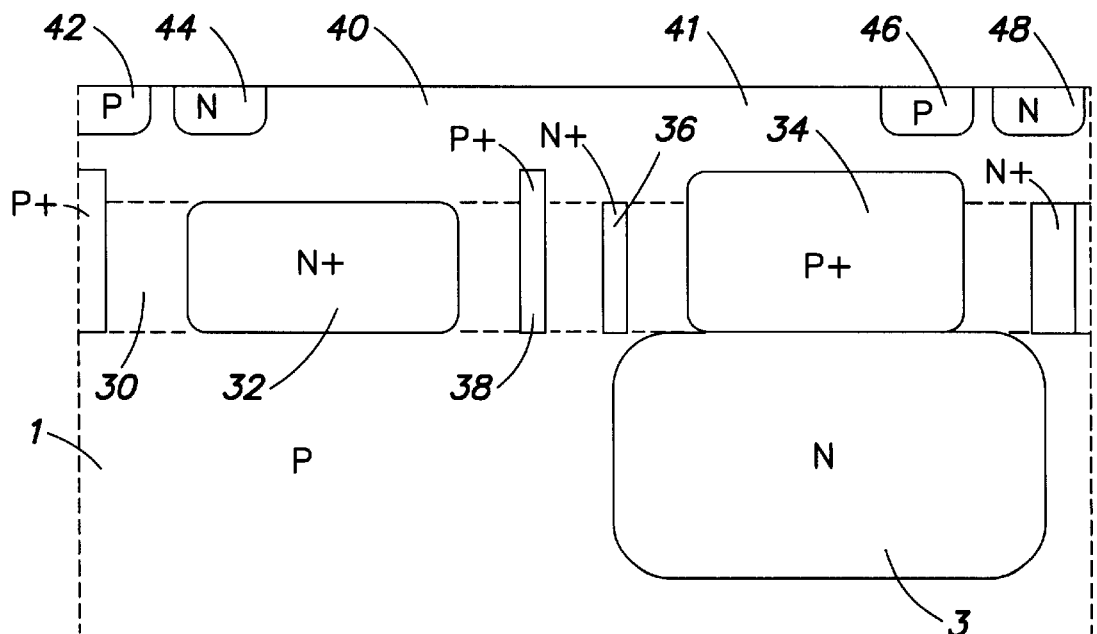

At a next step illustrated in FIG. 3C, a thermal anneal is performed so that layers 32, 34, 36, and 38 extend in particular under the entire thickness of epitaxial layer 30. After this step, it should be noted that region 34 contacts underlying insulating region 3 of the PNP transistor. However, the lateral diffusions of regions 32 to 38 must be limited so that the dopants of these various regions do not combine. Preferably, it will be ascertained that the diffusion fronts do not join.

After these anneals, a new epitaxial deposition step is performed to form an epitaxial layer designated by reference 40 on the NPN transistor side and by reference 41 on the PNP transistor side. Dopings are performed so that region 40 is N-type doped and region 41 is P-type doped. Heavily-doped regions formed from the upper surface of layer 40–41, that is, a P-type region 42 for contacting a portion of buried layer 38 to enable a substrate biasing contact, a region 44 intended for joining buried layer 32 and for forming a collector well, a P region 46 intended for joining region 34 and for forming a collector well, an N-type region 48 intended for at least partially joining buried ring 36 to appropriately bias it, have also been illustrated.

Figure 3D:
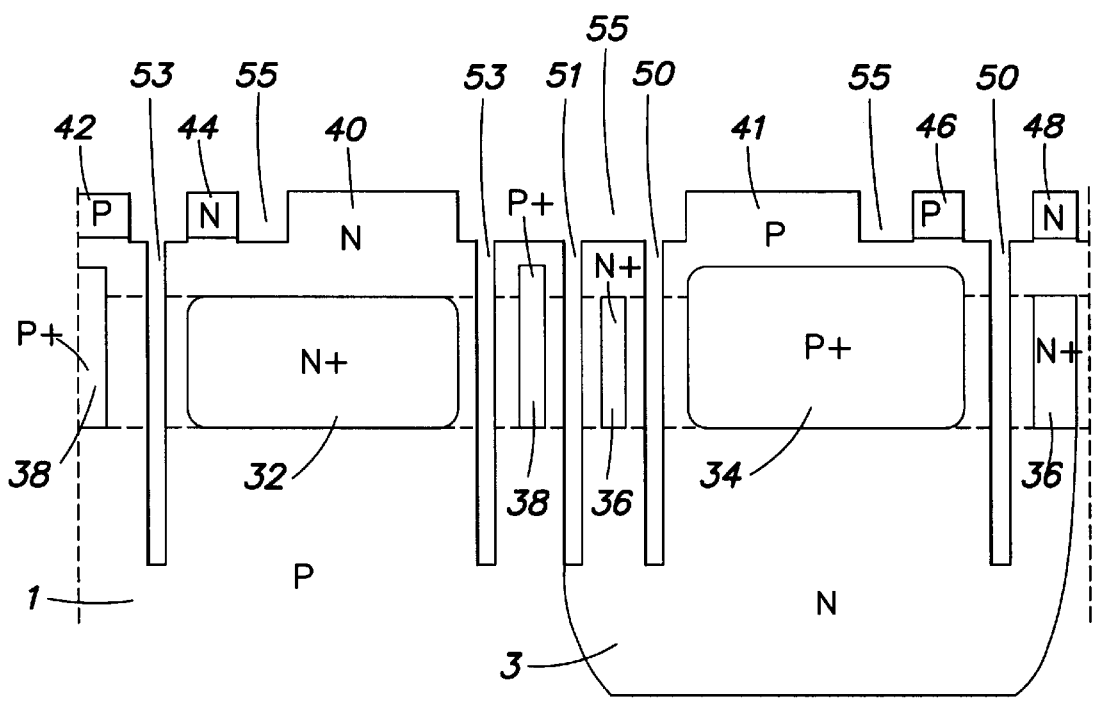

At a next step illustrated in FIG. 3D, deep trenches are formed to laterally separate various regions of the component. According to a significant aspect of the present invention, a trench 50 is provided at the periphery of the PNP transistor, this trench crossing the two epitaxial layers 30 and 40 and penetrating into substrate 1. The depth of this trench is chosen so that, after all the anneals, there is a continuity of N-type doped regions between region 3 arranged under the collector and N$^+$ ring 36 on which a contact is taken via an N-type surface region 48.

Preferably, other trenches 51, 53 formed at the same time as trench 50 to delimit NPN transistor areas of substrate biasing contact recovery and/or insulation areas are provided. Trenches 51 separate buried layers 36 and 38. Trench 53 separates the NPN transistor from buried layer 38. Further, shallow trenches 55 formed from the surface to delimit various regions should be noted in FIG. 3D. In a BICMOS-type technology, trenches 55 may be formed "gratuitously" since similar trenches are generally provided on the CMOS structure side.

Figure 3E:
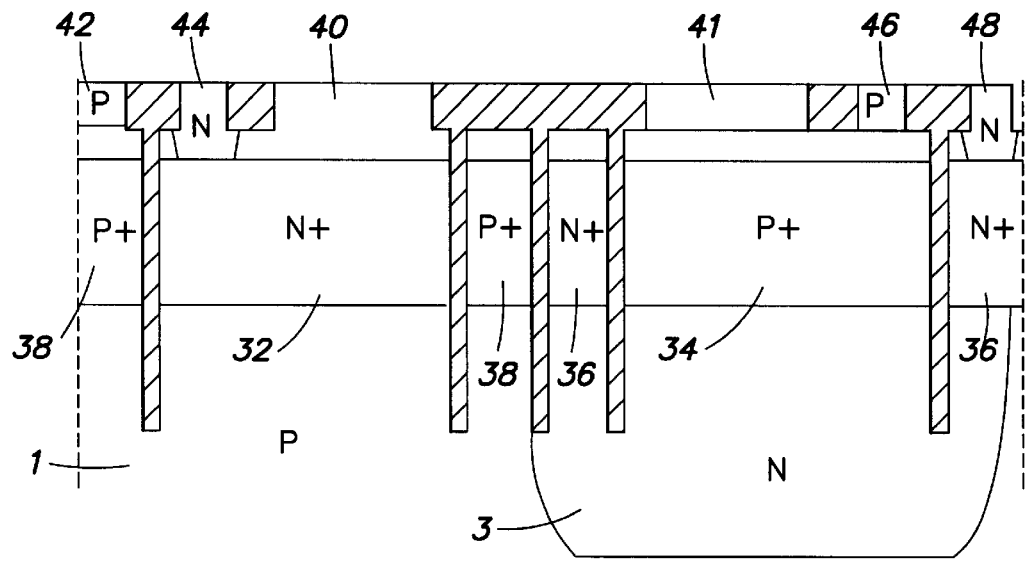

At the step of FIG. 3E, the trenches are filled up. Preferably, an anneal is first performed to create a thermal oxide layer, after which a CVD filling, for example with SiO2 or polysilicon, is performed. A chemical-mechanical planarization (CMP) completes and possibly ends the insulating trench forming process. During these steps, the various regions previously formed diffuse.

Figure 3F:
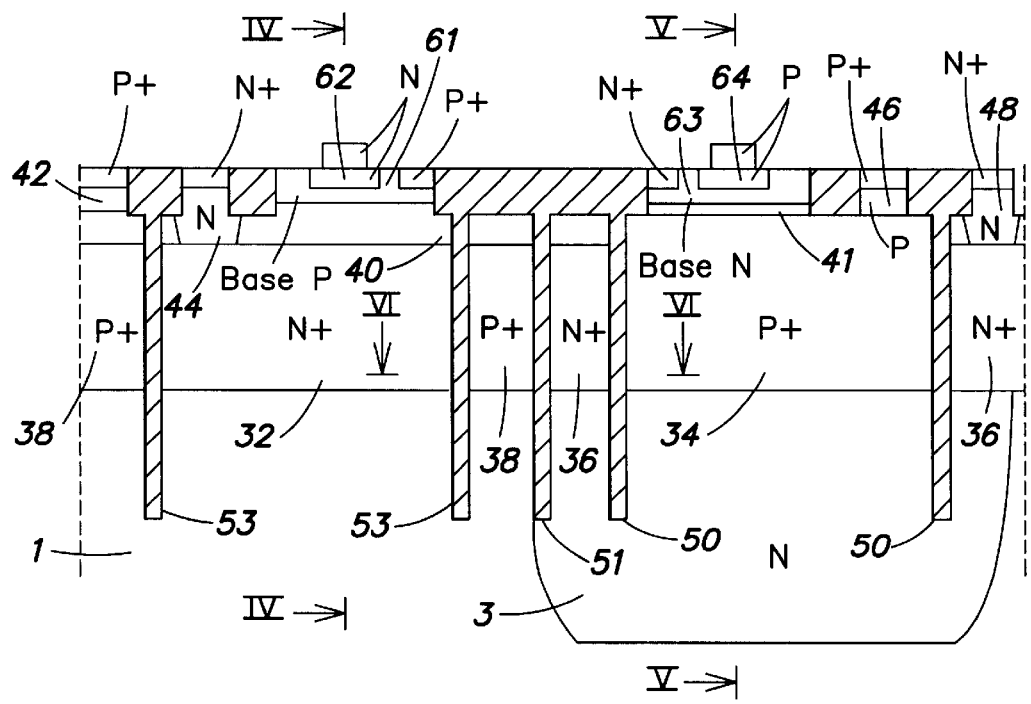

At the step illustrated in FIG. 3F, a base region 61 and an emitter region 62 are formed in N-type layer 40 for the NPN transistor and a base region 63 and an emitter region 64 are formed in region 41 for the PNP transistor.

Finally, the various insulation and contact forming steps will be conventionally carried out.

As compared to the conventional method described in relation with FIG. 1, the method according to the present invention has in particular two main differences.

A first difference is that the present invention provides a double epitaxy, the collector buried layers of the NPN and PNP transistors being formed from the first epitaxy while the insulation layer of the PNP transistor is formed from the substrate before this first epitaxy. The second epitaxy actually corresponds to the single conventional epitaxy.

Due to the first epitaxy, the collector buried layer of the PNP transistor only slightly undergoes the influence of the insulation diffusion of this same PNP transistor and is only negligibly compensated by this diffusion. Thus, to obtain a collector buried layer with a determined doping level (and thus resistance level), a smaller implantation dose than in the prior method may be used. This buried layer will thus rise less high up at the end of the process. As a result, the thickness of the second epitaxial layer, which corresponds to the single epitaxial layer of the conventional method, can be chosen to be sufficiently low to obtain an NPN transistor of optimal quality.

A second difference between the method of the present invention and the method of prior art is the provision of deep trenches completely crossing the two epitaxial layers and penetrating into the underlying substrate. The presence of these trenches especially ensures that collector buried layers 32, 34 have a limited lateral extension. On the PNP transistor side, region 36 used for the contact with insulating region 3 can be located very close to this buried layer (the distance being set by the trench thickness) without increasing the capacitance between the collector and the insulating layer on the PNP transistor side. On the NPN transistor side, trenches 53 limit the lateral capacitance between collector 32 and substrate contact buried layer 38.

Figure 2A:
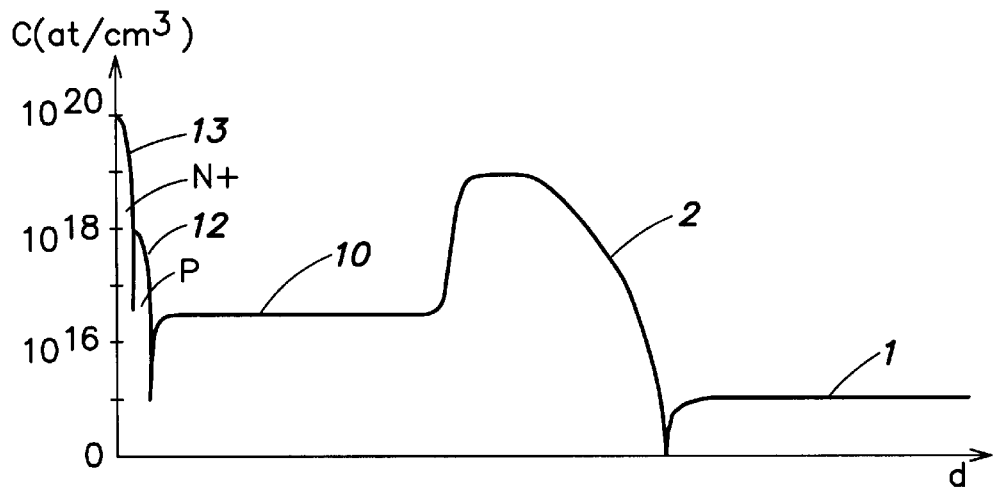
FIGS. 2A to 2C, previously described, are curves of the concentration as a function of depth according to various cross-sections of the structure of FIG. 1.
Figure 2B:
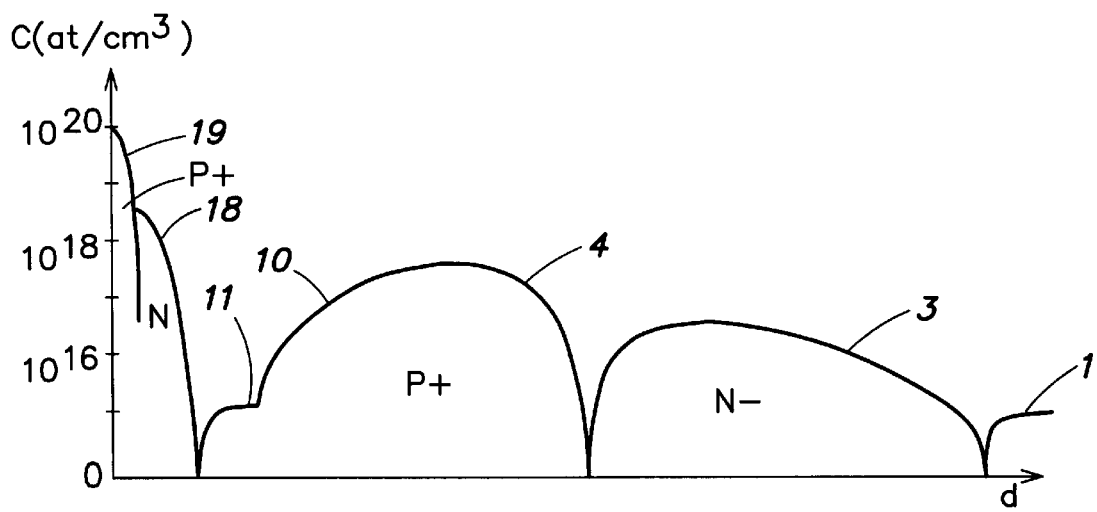
Figure 2C:
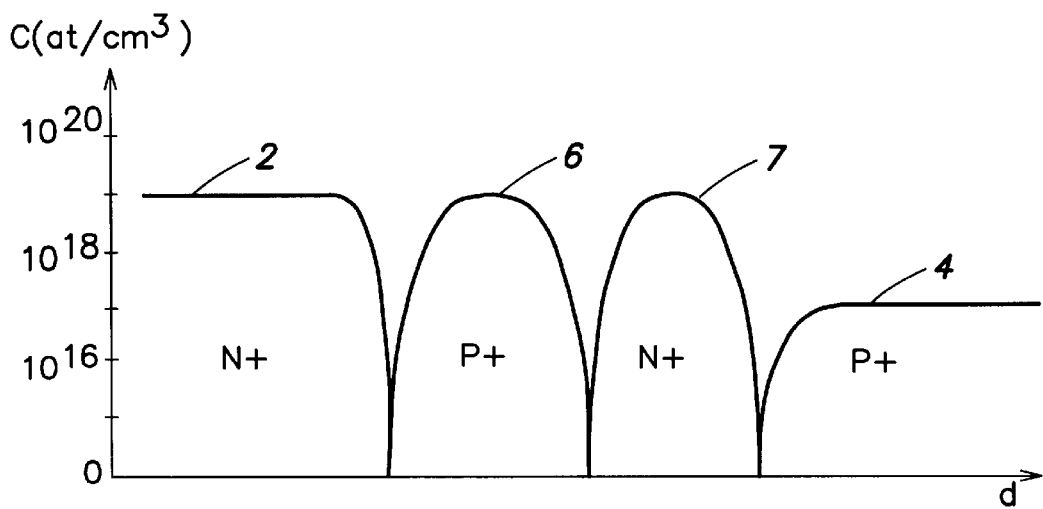
Figure 4A:
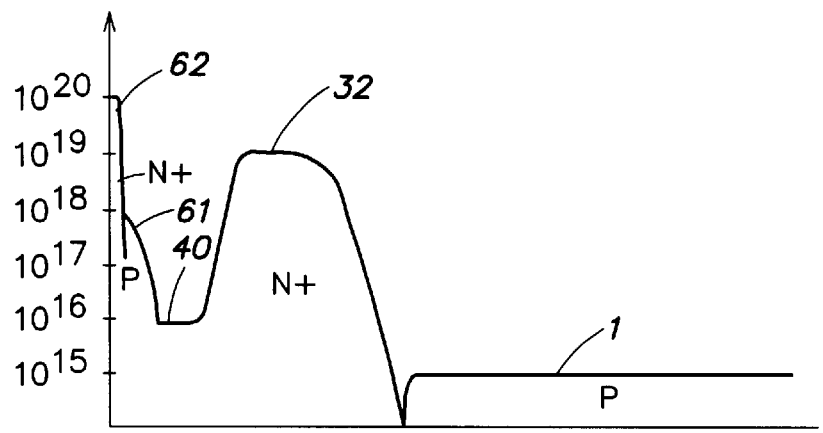
FIGS. 4A to 4C are curves of the concentration as a function of distance taken along lines IV-IV, V-V, and VI-VI of FIG. 3F.
Figure 4B:
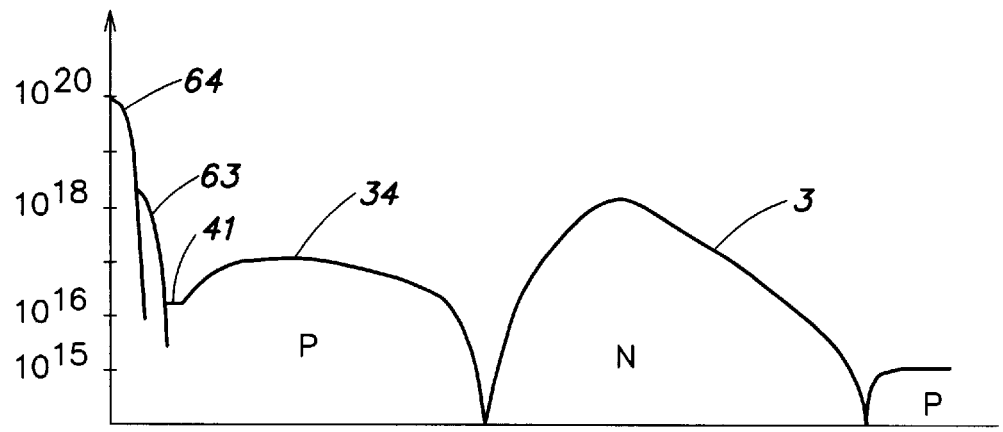
Figure 4C:
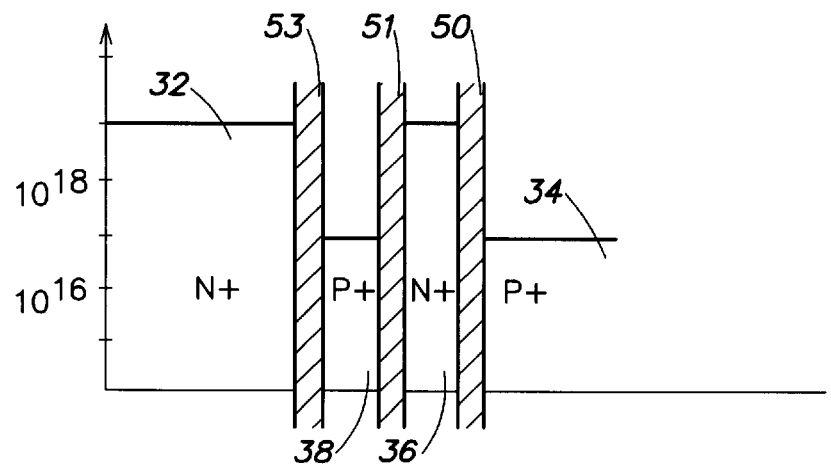

The characteristics of a structure according to the present invention are illustrated in FIGS. 4A–4C taken along the same cross-section planes as FIGS. 2A–2C. In the drawings, the curve portions are designated by the references of the corresponding layers and regions. FIG. 4A is a cross-section view along line IV-IV of FIG. 3F. FIG. 4B corresponds to a cross-section view along line V-V through the NPN transistor. FIG. 4C corresponds to a cross-section view along line VI-VI transversally to the separation area between the collector buried layers of the NPN and PNP transistors.

These curves clearly show that the doping level of N-type insulating region 3 can be increased without affecting the doping level of buried collector region 34 of the PNP transistor. As a result, as especially illustrated by a comparison between FIGS. 4C and 2C, the effective doping of layers 34 and 38 at the end of the process will only be identical while, in prior art, this effective doping is smaller for buried layer 4 than for region 6 due to the compensation by the N dopants of insulating layer 3 in layer 4.

In a specific embodiment, to give an example of orders of magnitude, the following numerical data may be chosen to implement the method:

doping of emitter 62: from $10^{19}$ to $10^{21}$ at/cm$^3$ doping of emitter 64: from $10^{19}$ to $10^{21}$ at/cm$^3$ doping of P base 61: from $10^{17}$ to $10^{19}$ at/cm$^3$ doping of N base 63: from $10^{17}$ to $10^{19}$ at/cm$^3$ doping of insulating layer 3: from $10^{16}$ to $10^{19}$ at/cm$^3$ doping of P$^+$ collector 34: from $10^{16}$ to $10^{19}$ at/cm$^3$ doping of N$^+$ collector 32: from $10^{18}$ to $10^{20}$ at/cm$^3$ diffusion depth of area 3: from 1 to 6 $\mu$m thickness of the first epitaxial layer: from 1 to 5 $\mu$m thickness of the second epitaxial layer: from 0.5 to 2 $\mu$m width of the deep trench: from 0.2 to 2 $\mu$m.

Figure 5:
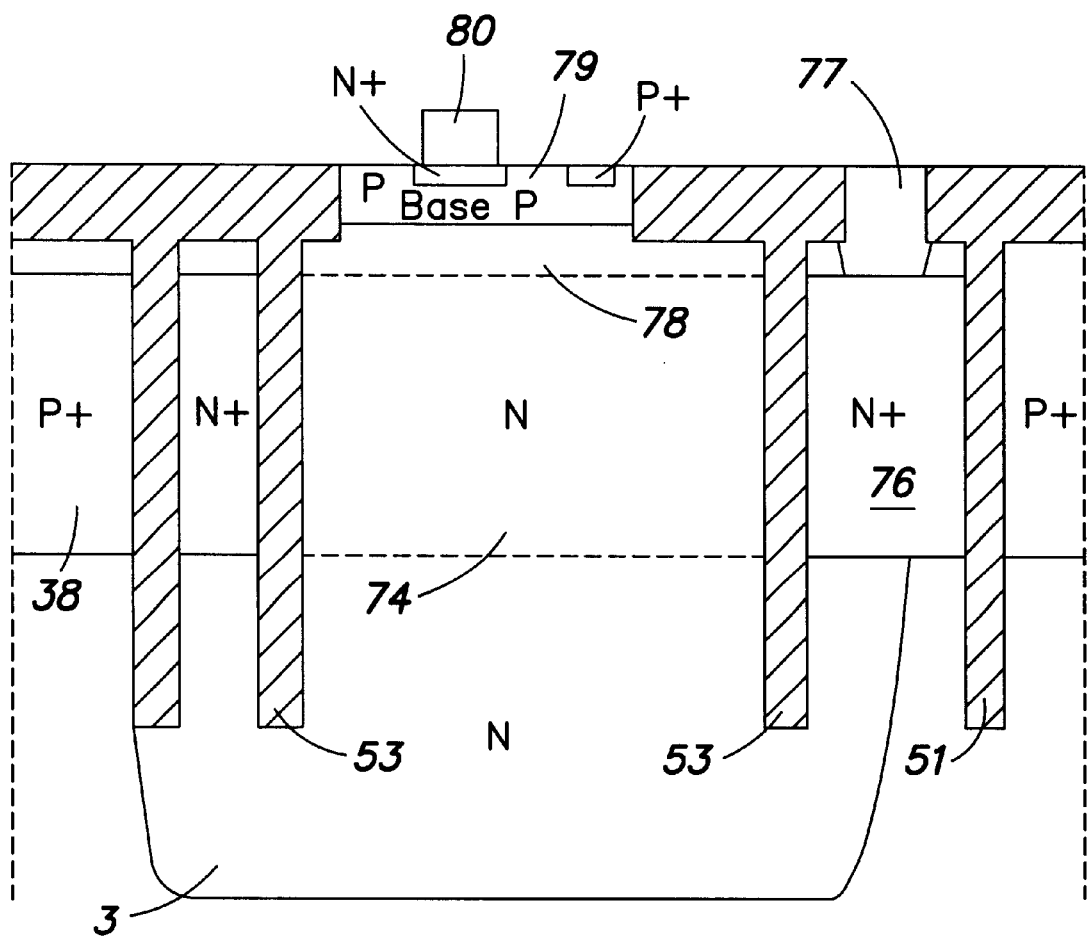
FIG. 5 is a cross-section view of an alternative of an NPN transistor according to the present invention.

FIG. 5 shows an alternative NPN transistor according to the present invention optimized in terms of breakdown voltage. An N-type doped region 3 is formed in substrate 1. An N-type doped region 74 is formed in the first epitaxial silicon layer. The periphery of N regions 3 and 74 is similar to the periphery of previously-described regions 3 and 34. It further includes the deep trenches, a heavily-doped N-type silicon area 76 formed in the first epitaxial layer, and an area 77 of surface contact with this area. An N-type doped region 78 in the second epitaxial layer completes the collector of this bipolar transistor.

Emitter-base structure 79–80 is formed conventionally from the silicon surface. This structure may be identical in terms of doping to that of the previously-described NPN transistor.

The collector of this bipolar transistor is formed of regions 78 and 74, the doping profile of which defines the breakdown voltage of the device. The electric contact on this collector is formed by regions 3, 76, and 77. The topology of this collector contact is very favorable to a good control of the breakdown of the transistor's base-collector junction, since the potential of area 77 does not directly act upon the electric field in area 78–79.

Of course, the present invention is likely to have various alterations, modifications, and improvements which will readily occur to those skilled in the art. The various conductivity types may be inverted. Various means may be used to form the various doped areas. Those skilled in the art may choose the dopants according to their experience. For example, for region 3, they will perform a phosphorus doping, a boron doping for P-type implanted regions 34, 38, and an arsenic doping for buried collector region 32 of the NPN transistor.

No top view has been shown in the different drawings. Those skilled in the art will choose the dimensions according to the power characteristics of the various components and to the possibilities of the technological processes that they will use. Further, trenches respectively located at the periphery of the NPN and PNP transistors have previously been mentioned. It should be noted that in some implementations, these trenches may be formed on a portion only of the periphery of one at least of these transistors.

Further, only the forming of bipolar transistors has been described herein. It should be noted that, based on the structure illustrated in FIG. 3C, instead of carrying on the process to form a bipolar transistor, the process could be carried on to form MOS transistors. In particular, if an N-channel MOS transistor is formed above $P^+$ region 34, this MOS transistor will have the advantage as compared to conventional structures to have a very good vertical insulation with respect to the substrate due to the fact that $P^+$ layer 34 and N layer 3 can have a freely chosen doping level.

The forming of complementary MOS transistors (CMOS) is easily adaptable to the substrate obtained to form circuits either of BICMOS type or purely of CMOS type. The high values of the dopings of the buried layers, associated with an optional insulation by deep trenches, enable these circuits based on CMOS transistor to be made insensitive to the triggering of parasitic thyristors inherent to this type of circuit and to electric signals running through the substrate.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing a bipolar transistor in a substrate of a first conductivity type, including the steps of:
    forming in the substrate a first area of a second conductivity type;
    forming by epitaxy a first silicon layer;
    forming in this first silicon layer, and substantially above the first area, a second heavily-doped doped area of the first conductivity type;
    forming at the periphery of this second area a third area of the second conductivity type separate from the second area;
    forming by epitaxy a second silicon layer;
    forming a deep trench crossing the first silicon layer and the second silicon layer, penetrating into the substrate and laterally separating the second area from the third area; and
    performing an anneal such that the dopant of the third area is continuous with that of the first area.

2. The method of claim 1, wherein the first conductivity type is type P and the second conductivity type is type N, the formed transistor being a PNP transistor, and the method further includes the forming of an NPN-type transistor for which a heavily-doped N-type layer is formed in the first silicon layer, the region corresponding to the NPN transistor being separated from the region corresponding to the PNP transistor by at least one trench.

3. The method of claim 2, wherein an NPN transistor, comprising a collector a buried layer corresponding to said first area, is further formed.

4. A method of forming a semiconductor device on a substrate of a first conductivity type, comprising:
    forming a first region of a second conductivity type in the substrate;
    forming a first epitaxial layer on the substrate;
    forming a second region of the second conductivity type in the first epitaxial layer;
    forming a second epitaxial layer on the first epitaxial layer;
    forming a well of the first conductivity type in the second epitaxial layer; and
    forming a third region of the second conductivity type in the well.

5. The method of claim 4, further comprising forming a fourth region of the first conductivity type in the first epitaxial layer.

6. The method of claim 5, wherein the fourth region is formed at a periphery of the second region.

7. The method of claim 4, further comprising forming trenches that isolate the second region.

8. The method of claim 4, further comprising:
    forming a fifth region of the second conductivity type in the first epitaxial layer; and
    forming an area in the second epitaxial layer in contact with the fifth region.

9. The method of claim 4, further comprising forming a sixth region of the first conductivity type in the well.

10. The method of claim 4, wherein the third region and the well are electrodes of the semiconductor device.

11. The method of claim 8, wherein the area in the second epitaxial layer is an electrode of the semiconductor device.

12. A method of forming a first semiconductor device and a second semiconductor device on a substrate of a first conductivity type, comprising:
    forming a first region of the second conductivity type in the substrate;
    forming a first epitaxial layer on the substrate;
    forming a second region of the second conductivity type in the first epitaxial layer;
    forming a third region of the first conductivity type in the first epitaxial layer;
    forming a second epitaxial layer on the first epitaxial layer;
    forming a fourth region of the first conductivity type in the second epitaxial layer;
    forming a fifth region of the second conductivity type in the second epitaxial layer;
    forming a first well of the first conductivity type in the second epitaxial layer;
    forming a second well of the second conductivity type in the second epitaxial layer;

forming a sixth region of the first conductivity type in the second well; and forming a seventh region of the second conductivity type in the first well, wherein the first region, third region, fourth region, second well and sixth region comprise the first semiconductor device and the second region, fifth region, first well and seventh region comprise the second semiconductor device.

13. The method of claim 12, further comprising forming trenches that isolate the first semiconductor device and the second semiconductor device.

14. The method of claim 12, further comprising forming an eighth region of the first conductivity type in the first epitaxial layer.

15. The method of claim 14, wherein the eighth region is formed at a periphery of the second region.

16. The method of claim 12, further comprising forming a ninth region of the first conductivity type in the second epitaxial layer.

17. The method of claim 12, further comprising forming a tenth region of the second conductivity type in the first epitaxial layer.

18. The method of claim 17, wherein the tenth region is formed at a periphery of the third region.

19. The method of claim 17, further comprising forming an eleventh region of the second conductivity type in the second epitaxial layer in contact with the tenth region.

20. The method of claim 12, further comprising forming a twelfth region of the first conductivity type in the first well.

21. The method of claim 12, further comprising forming a thirteenth region of the second conductivity type in the second well.

22. The method of claim 12, wherein the second well, the fourth region and the sixth region are electrodes of the first semiconductor device, and the first well, the fifth region and the seventh region are electrodes of the second semiconductor device.

* * * * *

UNITED STATES PATENT AND TRADEMARK OFFICE
CERTIFICATE OF CORRECTION

PATENT NO. : 6,607,960 B2
DATED : August 19, 2003
INVENTOR(S) : Yvon Gris and Thierry Schwartzmann It is certified that error appears in the above-identified patent and that said Letters Patent is hereby corrected as shown below:

Column 2,
Line 40, should read -- level of the shown cross-section, the doping level of insu- --

Column 4,
Line 14, should read -- tion with the accompanying drawings. --

Column 7,
Line 60, should read -- the first area, a second heavily-doped area of the --

Column 8,
Line 12, should read -- comprising a collector buried layer corresponding to said --

Signed and Sealed this

Seventh Day of October, 2003

JAMES E. ROGAN
*Director of the United States Patent and Trademark Office*